(12) United States Patent
Lee

(10) Patent No.: US 12,255,474 B2
(45) Date of Patent: Mar. 18, 2025

(54) BATTERY PACK POWER CUTTING OFF APPARATUS

(71) Applicant: LG ENERGY SOLUTION, LTD., Seoul (KR)

(72) Inventor: Sung Gun Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 555 days.

(21) Appl. No.: 17/629,291

(22) PCT Filed: Aug. 7, 2020

(86) PCT No.: PCT/KR2020/010506
§ 371 (c)(1),
(2) Date: Jan. 21, 2022

(87) PCT Pub. No.: WO2021/025537
PCT Pub. Date: Feb. 11, 2021

(65) Prior Publication Data
US 2022/0247187 A1 Aug. 4, 2022

(30) Foreign Application Priority Data

Aug. 8, 2019 (KR) .......................... 10-2019-0096999

(51) Int. Cl.
*H02J 7/00* (2006.01)
*G01R 31/396* (2019.01)
(Continued)

(52) U.S. Cl.
CPC .......... *H02J 7/0031* (2013.01); *H02J 7/0047* (2013.01); *H02J 7/007* (2013.01); *G01R 31/396* (2019.01);
(Continued)

(58) Field of Classification Search
CPC ........ H02J 7/0031; H02J 7/0047; H02J 7/007; H02J 7/00032; H02J 13/00026; G01R 31/396; H02H 7/18
(Continued)

(56) References Cited

U.S. PATENT DOCUMENTS 9,854,438 B2  12/2017 Luke et al.
10,081,248 B2   9/2018 Chen
(Continued)

FOREIGN PATENT DOCUMENTS

CN    102110862 A    6/2011
CN    102217116 A   10/2011
(Continued)

OTHER PUBLICATIONS

Extended European Search Report dated Oct. 17, 2022 for Application No. 20849330.4.
(Continued)

*Primary Examiner* — Edward Tso
*Assistant Examiner* — Aaron Piggush
(74) *Attorney, Agent, or Firm* — Birch, Stewart, Kolasch & Birch, LLP

(57) ABSTRACT

A battery pack power cutting off apparatus is discussed, and includes a power cutoff configured to block a line through which a charge/discharge current of a battery module flows, a communicator configured to receive an operation signal of the power cutoff from an external device, and a switching configured to control to apply power to a heater resistor included in the power cutoff based on an operation signal of the power cutoff, wherein when power is applied to the heater resistor and generates heat, the power cutoff operates to block the current flowing through the line.

18 Claims, 5 Drawing Sheets

(51) Int. Cl.
*H02H 7/18* (2006.01)
*H02J 13/00* (2006.01)

(52) U.S. Cl.
CPC ............ *H02H 7/18* (2013.01); *H02J 7/00032* (2020.01); *H02J 13/00026* (2020.01)

(58) Field of Classification Search
USPC ................................ 320/107, 108, 134, 163
See application file for complete search history.

(56) References Cited

U.S. PATENT DOCUMENTS

| | | | |
|---|---|---|---|
| 2006/0139008 A1 | 6/2006 | Park | |
| 2009/0085521 A1* | 4/2009 | Kim | H02J 7/0031 320/134 |
| 2009/0130542 A1* | 5/2009 | Mizoguchi | H02J 7/0016 429/61 |
| 2010/0207735 A1 | 8/2010 | Kim | |
| 2011/0156650 A1 | 6/2011 | Yang et al. | |
| 2011/0156654 A1* | 6/2011 | Kim | H02J 7/0031 320/145 |
| 2011/0228436 A1* | 9/2011 | Lee | H02H 7/18 429/61 |
| 2011/0273137 A1* | 11/2011 | Nakatsuji | H02J 7/0031 320/107 |
| 2012/0008246 A1 | 1/2012 | Kim | |
| 2014/0062413 A1 | 3/2014 | Kim | |
| 2015/0200553 A1 | 7/2015 | Endo et al. | |
| 2018/0191179 A1* | 7/2018 | Yi | H02J 7/00719 |

FOREIGN PATENT DOCUMENTS

| | | |
|---|---|---|
| CN | 103683368 A | 3/2014 |
| CN | 104779661 A | 7/2015 |
| EP | 1 667 305 A1 | 6/2006 |
| JP | 9-17455 A | 1/1997 |
| JP | 2002-320334 A | 10/2002 |
| JP | 3768224 B1 | 4/2006 |
| JP | 2006-279844 A | 10/2006 |
| JP | 2007-141572 A | 6/2007 |
| JP | 5677171 B2 | 2/2015 |
| KR | 10-0938080 B1 | 1/2010 |
| KR | 10-1002530 B1 | 12/2010 |
| KR | 10-2014-0064093 A | 5/2014 |
| KR | 10-2015-0077064 A | 7/2015 |
| KR | 10-2017-0049198 A | 5/2017 |
| KR | 10-2017-0077707 A | 7/2017 |
| KR | 10-2017-0094689 A | 8/2017 |

OTHER PUBLICATIONS

International Search Report for PCT/KR2020/010506 (PCT/ISA/210) mailed on Nov. 17, 2020.

* cited by examiner

BATTERY PACK POWER CUTTING OFF APPARATUS

TECHNICAL FIELD

Cross-Reference to Related Applications

This application claims the benefit of Korean Patent Application No. 10-2019-0096999, filed on Aug. 8, 2019, in the Korean Intellectual Property Office, the disclosure of which is incorporated herein in its entirety by reference.

Technical Field

The present invention relates to an apparatus for cutting off power to a battery pack.

BACKGROUND ART

In the case of a battery pack, when one of the switching elements (Field Effect Transistors (FETs)) that control charging/discharging of the battery by the battery management system (BMS) is burned out, current flows through the unburned switching element, so that a path of current may be additionally formed.

In order to prevent such a problem, conventionally, as a protection element that is connected in series to the charge/discharge line of the battery and which can block the charge/discharge line by controlling the battery management system (BMS), for example, a signal fuse, is also used. Therefore, a method of protecting the battery pack by applying a fault signal from the battery management system (BMS) to the protection element when an abnormality such as overvoltage, undervoltage, or overheating occurs, was used.

However, when a failure occurs in a battery management system (e.g., MCU and ASIC) that transmits a signal to the protection element, there was a problem that the protection element cannot operate normally.

In addition, conventionally, when an unauthorized battery pack is mounted due to theft or hacking, there is no method to block the charging/discharging of the battery pack from the outside.

DISCLOSURE OF THE INVENTION

Technical Problem

An object of the present invention is to provide a battery pack power cutting off apparatus capable of externally controlling a charging/discharging blocking function of a protection element provided in a battery pack, and externally cutting off power to a battery pack in which a security problem occurs.

Technical Solution

A battery pack power cutting off apparatus according to an embodiment of the present invention includes: a power cutoff configured to block a line through which a charge/discharge current of a battery module flows; a communicator configured to receive an operation signal of the power cutoff from an external device; and a switching configured to control to apply power to a heater resistor included in the power cutoff based on an operation signal of the power cutoff, wherein when power is applied to the heater resistor and generates heat, the power cutoff operates to block the current flowing through the line.

The battery pack power cutting off apparatus according to an embodiment of the present invention may further include a control configured to control the charging/discharging of the battery module, and control the power cutoff to block the line of the charge/discharge current when an abnormality in the battery module is detected.

The battery pack power cutting off apparatus according to an embodiment of the present invention may further include a receptor configured to receive the operation signal of the power cutoff from the control or the communicator, and transmit power based on the operation signal to the switching.

The battery pack power cutting off apparatus according to an embodiment of the present invention may further include a switching control configured to control the flow of a charge/discharge current of the battery module.

In the battery pack power cutting off apparatus according to an embodiment of the present invention, the switching may be a field effect transistor (FET).

The battery pack power cutting off apparatus according to an embodiment of the present invention may further include a diagnoser configured to detect an abnormality based on at least one of voltage, current and temperature of the battery module.

In the battery pack power cutting off apparatus according to an embodiment of the present invention, when a server detects a security violation for the battery pack, the communicator may receive an operation signal of the power cutoff from the external device.

In the battery pack power cutting off apparatus according to an embodiment of the present invention, a unique number may be assigned to each of the battery packs in advance, and the server may determine a battery pack in which a security violation is detected based on the unique number.

In the battery pack power cutting off apparatus according to an embodiment of the present invention, a theft number is assigned to the battery pack in which the security violation is detected by the server.

In the battery pack power cutting off apparatus according to an embodiment of the present invention, the communicator may communicate with the outside through Near Field Communication (NFC).

In the battery pack power cutting off apparatus according to an embodiment of the present invention, the communicator may communicate with an external device including at least one of a charging station, a home charger, or another battery pack.

A battery pack power cutting off method according to an embodiment of the present invention is a power cutting off method of a pack of a battery including a power cutting off element and a communication element, and includes: receiving an operation signal of a power cutoff from an external device through the communicator; applying power to a heater resistor included in the power cutoff based on the operation signal of the power cutoff; and blocking a line through which a charge/discharge current of a battery flows when power is applied to the heater resistor to generate heat.

Effects of the Invention

An object of the present invention is to provide a battery pack power cutting off apparatus capable of externally controlling a charging/discharging blocking function of a protection element provided in a battery pack, and externally cutting off power to a battery pack in which a security problem occurs.

MODE FOR CARRYING OUT THE INVENTION

Figure 1:
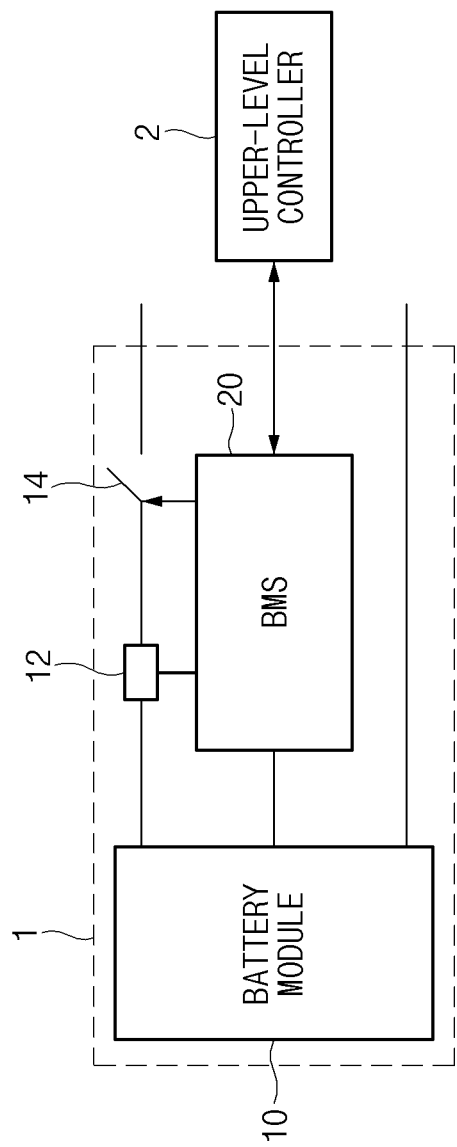
FIG. 1 is a block diagram showing the configuration of a general battery management system.

Hereinafter, various embodiments of the present invention will be described in detail with reference to the accompanying drawings. In this document, the same reference numerals are used for the same components in the drawings, and duplicate descriptions of the same components are omitted.

For the various embodiments of the present invention disclosed in this document, specific structural or functional descriptions have been exemplified for the purpose of describing the embodiments of the present invention only and various embodiments of the present invention may be implemented in various forms and should not be construed as being limited to the embodiments described in this document.

Expressions such as "first", "second", "first", or "second" used in various embodiments may modify various elements regardless of their order and/or importance, and do not limit the corresponding elements. For example, without departing from the scope of the present invention, a first component may be referred to as a second component, and similarly, a second component may be renamed and referred to as a first component.

Terms used in this document are only used to describe a specific embodiment, and may not be intended to limit the scope of other embodiments. The terms of a singular form may include plural forms unless otherwise specified.

All terms used herein, including technical or scientific terms, may have the same meaning as commonly understood by a person of ordinary skill in the art. Terms defined in a commonly used dictionary may be interpreted as having the same or similar meaning as the meaning in the context of the related technology, and are not interpreted as ideal or excessively formal meanings unless explicitly defined in this document. In some cases, even terms defined in this document cannot be interpreted to exclude embodiments of the present invention.

FIG. 1 is a block diagram showing the configuration of a general battery management system.

Referring to FIG. 1, a configuration diagram schematically shows a battery control system including a battery pack 1 and an upper-level controller 2 included in an upper-level system according to an embodiment of the present invention.

As shown in FIG. 1, the battery pack 1 includes a battery module 10 consisting of one or more battery cells and capable of charging/discharging, a switching element 14 connected in series to the +(positive) terminal side or the −(negative) terminal side of the battery module 10 to control the charge/discharge current flow of the battery module 10, and a battery management system 20 for controlling and managing the voltage, current, temperature, and the like of the battery module 10 to prevent overcharging and overdischarging. Here, although the battery management system 20 is described as being connected to the battery module, it is connected for each battery cell to monitor and measure the voltage and current temperature of the battery cells. A battery cell management system is arranged for each battery cell, and each of the plurality of battery cell management systems may transmit and receive data to and from the battery management system 20 that monitors and controls the battery module. The battery cell management system is similar in operation and function to the battery management system 20.

Here, the switching element 14 is a semiconductor switching element for controlling the current flow for charging or discharging the battery module 10, and, for example, at least one MOSFET may be used.

In addition, in order to monitor the voltage, current, temperature, and the like of the battery module 10, the BMS 20 may measure or calculate voltages and currents such as gates, sources, and drains of semiconductor switching elements, and in addition, measure the current, voltage, temperature, and the like of the battery module using the sensor 12 provided adjacent to the semiconductor switching element 14. The BMS 20 is an interface for receiving values obtained by measuring the above-described various parameters, and may include a plurality of terminals and a circuit connected to these terminals to process input values.

In addition, the BMS 20 may control ON/OFF of the switching element 14, for example, a MOSFET, and may be connected to the battery module 10 to monitor the state of the battery module 10.

The upper-level controller 2 may transmit a control signal for the battery module to the BMS 20. Accordingly, the operation of the BMS 20 may be controlled based on a signal applied from the upper-level controller. The battery cell of the present invention may be included in a battery pack used for an ESS or a vehicle. However, it is not limited to these uses.

Since the configuration of the battery pack 1 and the configuration of the BMS 20 are known configurations, a more detailed description will be omitted.

Meanwhile, the power cutting off apparatus according to embodiments of the present invention may be connected to a battery pack to cut off power. However, the present invention is not limited thereto, and may be connected to each of the battery module 10 or a plurality of battery cells connected in series in the battery module 10 to cut off power to the battery cells.

Figure 2:
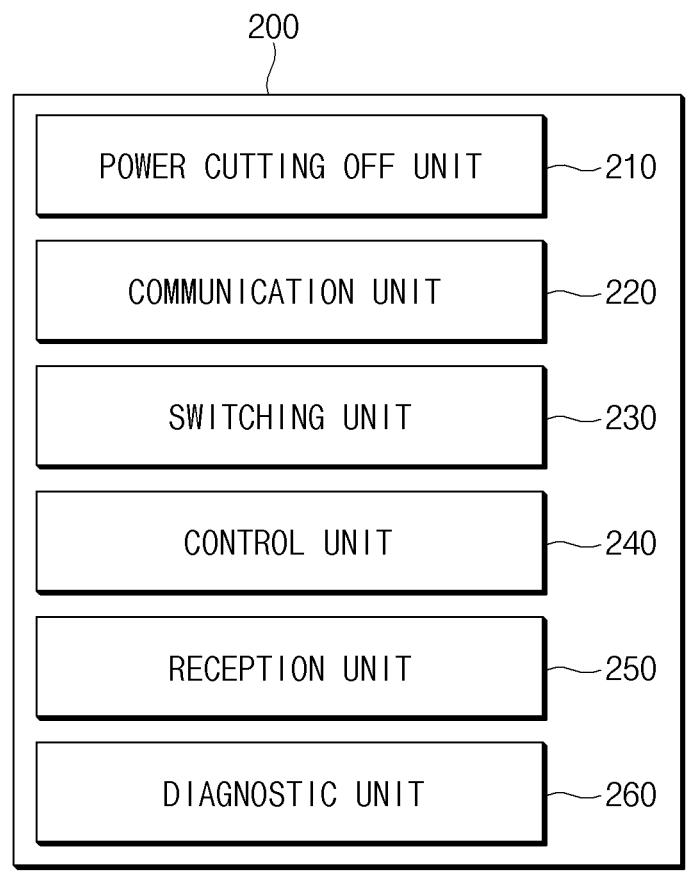
FIG. 2 is a block diagram showing a configuration of a battery pack power cutting off apparatus according to an embodiment of the present invention.

FIG. 2 is a block diagram showing the configuration of a battery pack power cutting off apparatus according to an embodiment of the present invention.

Referring to FIG. 2, the battery pack power cutting off apparatus 200 according to an embodiment of the present invention may include a power cutoff 210, a communicator 220, a switching 230, and a control 240. In addition, the battery pack according to an embodiment of the present invention may include a battery module including a plurality of battery cells capable of charging/discharging.

The power cutoff 210 may block a line through which the charge/discharge current of the battery module flows. In addition, the power cutoff 210 may include a heater resistor that is operated when the reference temperature is reached. In this case, when power is applied to the power cutoff 210 based on an operation signal received from the outside and the heater resistor is heated, the power cutoff 210 operates to block the current flowing through the charging/discharging line.

In addition, when faults such as over voltage, under voltage, or over temperature of the battery module are detected, the power cutoff 210 may block a line of charge/discharge current of the battery module by receiving an operation signal of the power cutoff 210 from the control 240.

In addition, even when an operation signal of the power cutoff 210 is received from an external device (e.g., a charging station, a home charger, a peripheral battery pack, etc.) by the communicator 220, the power cutoff 210 may block a line of charge/discharge current of the battery module by operating a heater resistor.

The communicator 220 may receive an operation signal of the power cutoff 210 from the outside. The communicator 220 may communicate with an external device or an external server including a charging station, a home charger, or other battery pack in the vicinity. At this time, the communicator 220 may communicate with the outside through a near field communication (NFC) method. However, the present invention is not limited thereto, and various communication methods may be used in addition to short-range communication.

In addition, if a security violation (e.g., theft or hacking) is detected for the battery pack in an external server, the communicator 220 may receive an operation signal of the power cutoff 210 from the outside in order to cut off the power of the corresponding battery pack.

The switching 230 may control to apply power to a heater resistor included in the power cutoff based on an operation signal of the power cutoff 210. That is, the switching 230 includes at least one switch, and may perform switching control so that the power cutoff 210 can cut off a line of charge/discharge current through on/off control of the switch.

The control 240 may control charging/discharging of the battery module, and when an abnormality in the battery module is detected, the control 240 may control the power cutoff 210 to block a line of charge/discharge current. That is, the control 240 functions to monitor the state of the battery module at normal times and control charging/discharging according to the state of charge of the battery module.

In addition, when an abnormality detection circuit detects an abnormality in the battery module (e.g., overvoltage, overcurrent, abnormal temperature, etc.), the control 240 may transmit an operation signal of the power cutoff 210 to the power cutoff 210. For example, the control 240 may be a battery management system (BMS) including an MCU, an ASIC, or the like.

Meanwhile, in FIG. 2, the battery pack power cutting off apparatus 200 according to an embodiment of the present invention may include a switching circuit unit. The switching circuit unit may include at least one switch, and may control the flow of current for charging/discharging the battery module through on/off control of the switch. For example, the switching circuit unit may be a Field Effect Transistor (FET).

In addition, the battery pack power cutting off apparatus 200 according to an embodiment of the present invention may include a receptor 250. The receptor 250 may receive an operation signal of the power cutoff 210 from the control 240 and the communicator 220. In this case, the receptor may optionally transmit the operation signal of the power cutoff 210 from the control 240 and the operation signal of the power cutoff 210 received from an external device through the communicator 220 to the power cutoff 210. For example, the receptor may be an OR circuit.

In addition, the battery pack power cutting off apparatus 200 according to an embodiment of the present invention may include a diagnoser 260 that detects an abnormality in the battery module based on at least one of voltage, current, and temperature of the battery module. When an abnormality in the battery module is detected, the diagnoser 260 may transmit an abnormality detection signal to the control 240. When an abnormality is detected, the control 240 may cut off a line of charge/discharge current of the battery module by transmitting an operation signal to the power cutoff 210.

Meanwhile, a unique number may be previously assigned to each of the battery packs, and the assigned unique number of the battery pack may be stored in an external server. In this case, the server may determine the battery pack in which the security violation is detected based on the unique number of the battery pack.

In addition, the server may assign a theft number to a battery pack in which a security violation is detected, and transmit the assigned theft number to an external device such as a charging station, a home charger, and a peripheral battery pack. Therefore, when a battery pack in which a security violation is detected communicates with an external device, by transmitting the operation signal of the power cutoff 210 to the communicator 220 of the battery pack, it is possible to disable the use of the battery pack in which security is a problem.

In this way, according to the battery pack power cutting off apparatus according to an embodiment of the present invention, the charging/discharging blocking function of the protection element provided in the battery pack can be externally controlled, and power can be cut off externally for the battery pack in which security problems occur.

Figure 3:
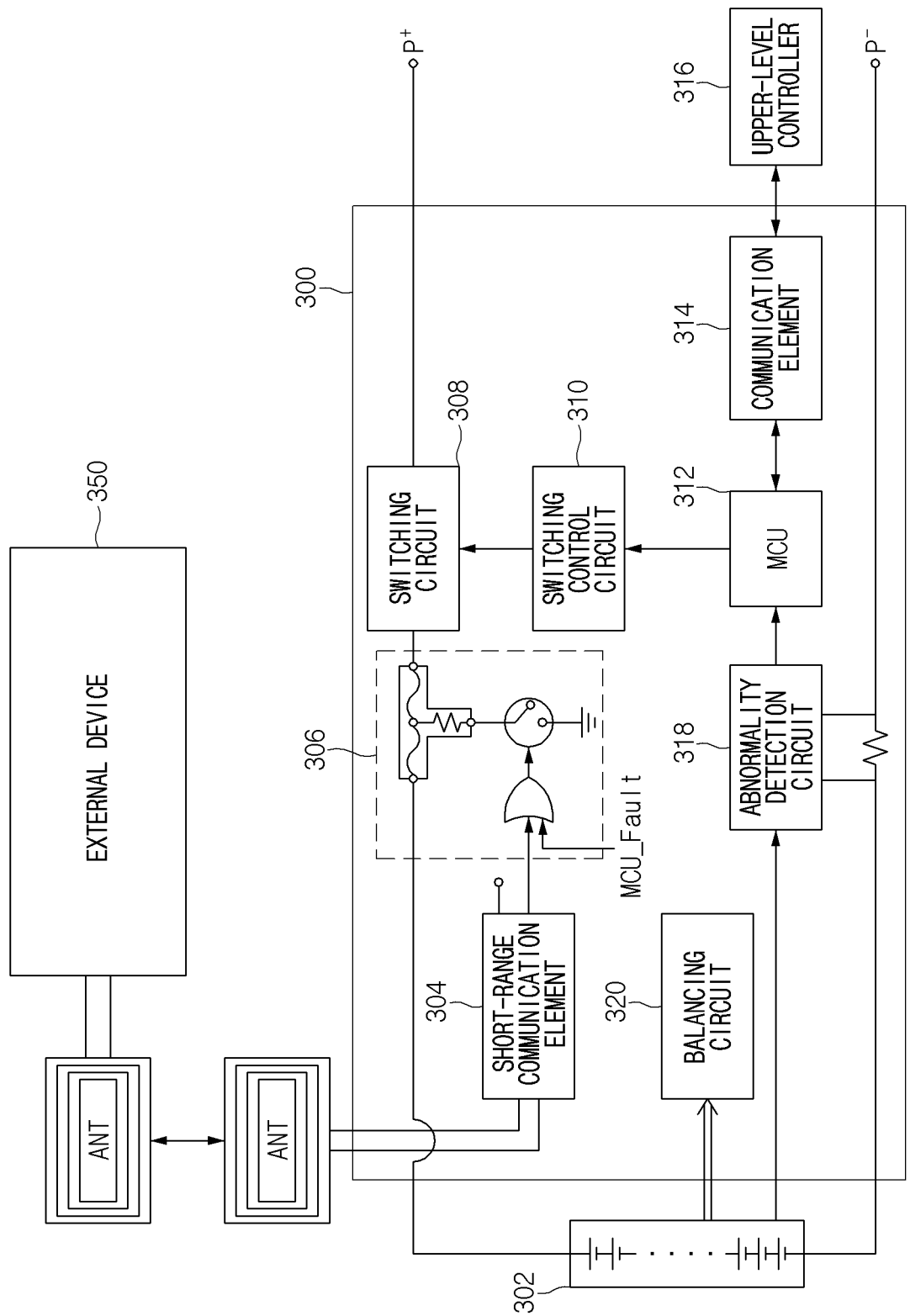
FIG. 3 is a circuit diagram showing a configuration of a battery pack according to an embodiment of the present invention.

FIG. 3 is a circuit diagram showing the configuration of a battery pack according to an embodiment of the present invention.

Referring to FIG. 3, the battery pack 300 according to an embodiment of the present invention may include a battery module 302, a short-range communication element 304, a power cut off circuit 306, a switching circuit 308, a switching control circuit 310, an MCU 312, a communication element 314, an upper-level controller 316, an abnormality detection circuit 318, and a balancing circuit 320.

The battery module 302 may include a plurality of battery cells capable of charging/discharging. In addition, the battery modules 302 may be connected in series or in parallel to form a battery pack.

The short-range communication element 304 is connected to the antenna ANT of the battery pack 300 to receive a signal from the antenna of the external device 350. For example, the short-range communication element 304 may be the communicator 220 of FIG. 2. In this case, the signal received through the short-range communication element 304 may be an operation signal of the power cut off circuit 306.

For example, the short-range communication element 304 may include an NFC tag chip. When the NFC tag chip receives a Radio Frequency (RF) signal in a passive manner, the chip is operated by receiving energy (Harvest). That is, the NFC tag chip may include an antenna causing inductive coupling due to a change in the magnetic field of the antenna of the adjacent external device 350, and a circuit element for bidirectional communication with an external device by inductive coupling.

In addition, the NFC tag chip may be assigned a separate PIN to transmit whether a signal is received or not to an external chip. That is, the short-range communication element 304 may block the charge/discharge path by operating the power cut off circuit through the PIN signal.

When the power cut off circuit 306 receives an operation signal of the power cutoff 210 from the short-distance communication element 304 or the MCU 312, it may operate a signal fuse to block a line of charge/discharge current. For example, the power cut off circuit 306 may include a fuse including a heater resistor, a switch, and an OR element. That is, the power cut off circuit 306 may perform functions of the power cutoff 210, the switching 230, and the receptor 250 of FIG. 2.

As shown in FIG. 3, the power cut off circuit 306 may selectively receive an operation signal of the power cut off circuit 306 from the short-range communication element 304 or the MCU 312 through an OR element, and turn on the switch to operate the heater resistor of the fuse, thereby blocking the path of the charge/discharge current.

The switching circuit 308 includes a switch, and may control the flow of current for charging/discharging the battery module through on/off control of the switch. In this case, the switching circuit 308 may include a FET. For example, the switching circuit 308 may be the above-mentioned switching circuit unit.

The switching control circuit 310 may function to control on/off of the switching circuit 308. For example, the switching control circuit 310 may be a FET driver.

The MCU 312 may monitor the state of the battery module 302 and control charging/discharging of the battery module 302 through the switching circuit 308. In addition, when an abnormality of the battery module 302 is detected through the abnormality detection circuit 318, the MCU 312 may control the power cut off circuit 306 to cut off a line of charge/discharge current. For example, the MCU 312 may be the control 240 of FIG. 2.

The communication element 314 may perform communication between the MCU 312 and the upper-level controller 316.

The upper-level controller 316 may transmit a control command signal to the MCU 312 through the communication element 314.

The abnormality detection circuit 318 may detect whether the battery module is abnormal (e.g., overvoltage or overheating) based on at least one of voltage, current, and temperature of the battery module. In addition, when an abnormality in the battery module 302 is detected, the abnormality detection circuit 318 may transmit a detection signal to the MCU 312, and the MCU 312 may cut off a line of charge/discharge current of the battery module 302 by transmitting an operation signal to the power cut off circuit 306. For example, the abnormality detection circuit 318 may be the above-described diagnose 260.

The balancing circuit 320 is a circuit composed of a switching element connected to both ends of each battery cell, a resistor, and an ADC. The balancing circuit 320 controls ON/OFF of the switching element according to the control of the MCU 312 to reduce the voltage by consuming the balancing current of the battery cell through the resistor, thereby adjusting the voltage of each battery cell to match.

Meanwhile, the external device 350 may include a charging station, a home charger, and a peripheral battery pack connected in series or in parallel. In this case, the external device 350 may communicate with the short-range communication element 304 through an antenna, and transmit an operation signal of the power cut off circuit 306 to the short-range communication element 304.

Figure 4:
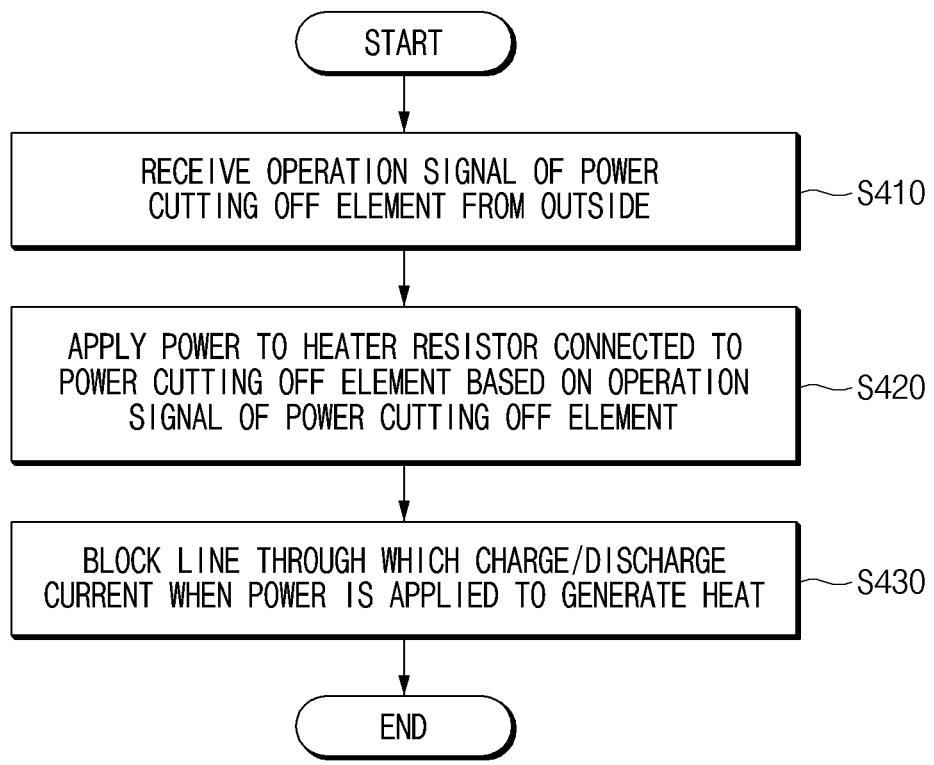
FIG. 4 is a flowchart illustrating a battery pack power cutting off method according to an embodiment of the present invention.

FIG. 4 is a flowchart illustrating a battery pack power cutting off method according to an embodiment of the present invention.

Referring to FIG. 4, the battery pack power cutting off method according to an embodiment of the present invention may be a method of cutting off power to a battery pack using a power cutting off element and a short-range communication element.

First, an operation signal of the power cutting off element may be received from the outside (S410). In this case, the power cutting off element may include a heater resistor that generates heat and operates when the reference temperature is reached.

In operation S410, for example, when an error occurs in the battery management system (BMS) that monitors the state of the battery module and controls charging/discharging, and the power cannot be cut off inside the battery pack, it is possible to receive the operation signal of the power cutting off element from an external device (e.g., charging station, home charger, other battery pack in the vicinity, etc.).

In addition, in operation S410, if a security violation (e.g., theft or hacking) is detected for the battery pack in an external server, it is possible to receive an operation signal of the power cutting off element from the outside in order to cut off the power of the corresponding battery pack.

Further, power may be applied to the heater resistor included in the power cutting off element based on the operation signal of the power cutting off element (S420). At this time, the operation signal of the power cutting off element may be received by a separate OR circuit, and the like, the switch may be turned on by the operation signal of the power cutting off element, and power based on the operating signal of the corresponding power cutting off element may be transmitted to the power cutting off element through a switch.

Next, when power is applied to the heater resistor to generate heat, the line through which the charge/discharge current flows may be blocked (S430). That is, when power is applied to the heater resistor and the temperature reaches a predetermined reference temperature or higher, the heater resistor operates to block the line of the charge/discharge current.

As such, according to the battery pack power cutting off method of the present invention, the charging/discharging blocking function of the protection element provided in the battery pack can be controlled externally, and external power can be turned off for a battery pack in which a security problem occurs.

Figure 5:
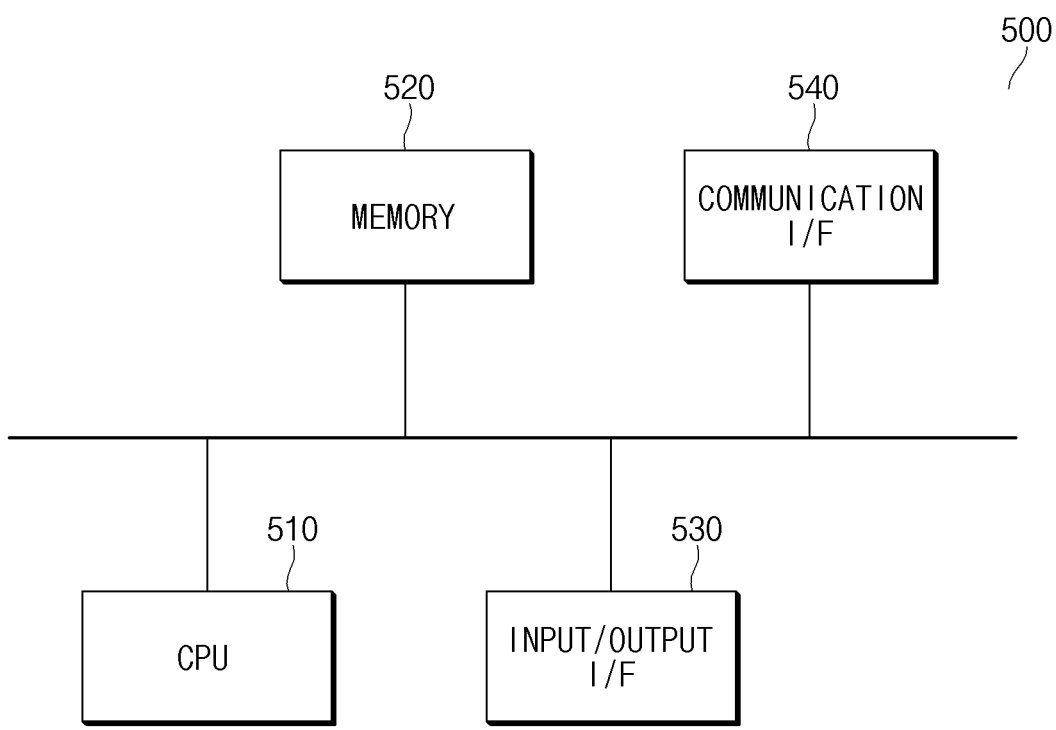
FIG. 5 is a diagram illustrating a hardware configuration of a battery pack power cutting off apparatus according to an embodiment of the present invention.

FIG. 5 is a diagram illustrating a hardware configuration of a battery pack power cutting off apparatus according to an embodiment of the present invention.

Referring to FIG. 5, a battery pack power cutting off apparatus 500 according to an embodiment of the present invention may include an MCU 510, a memory 520, an input/output I/F 530, and a communication I/F 540.

As shown in FIG. 5, the battery pack power cutting off apparatus 500 may include a microcontroller (MCU) 510 that controls various processes and configurations, a memory 520 in which an operating system program and various programs (e.g., a battery pack abnormality diagnosis program, or a battery pack temperature estimation program) are recorded, an input/output interface 530 that provides an input interface and an output interface between a battery cell module and/or a switching (e.g., a semiconductor switching element), and a communication interface 540 capable of communicating with an external (for example, upper-level controller) through a wired or wireless communication network. In this way, the computer program according to the present invention may be recorded in the memory 520 and processed by the microcontroller 510, and for example, may be implemented as a module that performs each functional block shown in FIG. 2.

In this way, according to the battery pack power cutting off apparatus according to an embodiment of the present invention, the charging/discharging blocking function of the protection element provided in the battery pack can be externally controlled, and power can be cut off externally for the battery pack in which security problems occur.

In the above, even if all the components constituting the embodiments of the present invention are described as being combined into one or operating in combination, the present invention is not necessarily limited to these embodiments. That is, within the scope of the object of the present invention, all of the constituent elements may be selectively combined and operated in one or more.

In addition, terms such as "include", "consist of" or "have" described above mean that the corresponding constituent components can be present unless otherwise stated, and it should be construed that other components may be further included rather than excluding other components. All terms, including technical or scientific terms, have the same meaning as commonly understood by one of ordinary skill in the art, unless otherwise defined. Terms commonly used, such as terms defined in the dictionary, should be interpreted as being consistent with the meaning of the context of the related technology, and unless explicitly defined in the present invention, they are not interpreted in an ideal or excessively formal sense.

The above description is merely illustrative of the technical idea of the present invention, and those of ordinary skill in the art to which the present invention pertains will be able to make various modifications and variations without departing from the essential characteristics of the present invention. Therefore, the embodiments disclosed in the present invention are not intended to limit the technical idea of the present invention, but to explain, and the scope of the technical idea of the present invention is not limited by these embodiments. The scope of protection of the present invention should be interpreted by the claims below, and all technical ideas within the scope equivalent thereto should be construed as being included in the scope of the present invention.

The invention claimed is:

1. A battery pack power cutting off apparatus comprising:
   a power cutoff circuit configured to block a line through which a charge/discharge current of a battery module flows, the power cutoff circuit including a heater resistor, a switch connected to the heater resistor, and an OR circuit connected to the switch;
   a communicator configured to receive an operation signal of the power cutoff circuit from an external device; and
   a switching element configured to control to apply power to the heater resistor included in the power cutoff circuit based on the operation signal of the power cutoff circuit provided from the OR circuit to the switch,
   wherein the OR circuit receives the operation signal of the power cutoff circuit from a control or the communicator and transmits the operation signal of the power cutoff circuit, and
   wherein when power is applied to the heater resistor and generates heat, the power cutoff circuit operates to block the current flowing through the line.

2. The battery pack power cutting off apparatus of claim 1, further comprising the control configured to control a charging/discharging of the battery module, and control the power cutoff circuit to block the line of the charge/discharge current when an abnormality in the battery module is detected.

3. The battery pack power cutting off apparatus of claim 2, further comprising a receptor configured to receive the operation signal of the power cutoff circuit from the control or the communicator, and transmit power based on the operation signal to the switching element.

4. The battery pack power cutting off apparatus of claim 3, wherein the receptor includes the OR circuit.

5. The battery pack power cutting off apparatus of claim 1, further comprising a switching control configured to control the flow of the charge/discharge current of the battery module.

6. The battery pack power cutting off apparatus of claim 5, wherein the switching element is a field effect transistor (FET).

7. The battery pack power cutting off apparatus of claim 1, further comprising a diagnoser configured to detect an abnormality in the battery module based on at least one of voltage, current and temperature of the battery module.

8. The battery pack power cutting off apparatus of claim 1, wherein when a server detects a security violation for one or more battery packs of the battery module, the communicator receives the operation signal of the power cutoff circuit from the external device.

9. The battery pack power cutting off apparatus of claim 8, wherein a unique number is assigned to each of the battery packs in advance, and
   wherein the server determines a battery pack of the battery packs in which the security violation is detected based on the unique number thereof.

10. The battery pack power cutting off apparatus of claim 8, wherein a theft number is assigned by the server to the battery pack in which the security violation is detected.

11. The battery pack power cutting off apparatus of claim 1, wherein the communicator communicates with the outside through Near Field Communication (NFC).

12. The battery pack power cutting off apparatus of claim 1, wherein the communicator communicates with the external device including at least one of a charging station, a home charger, and another battery pack.

13. The battery pack power cutting off apparatus of claim 1, wherein the operation signal of the power cutoff circuit is directly provided from the OR circuit to the switch.

14. The battery pack power cutting off apparatus of claim 1, wherein the OR circuit receives the operation signal of the power cutoff circuit directly from the control or the communicator.

15. A battery pack power cutting off method comprising:
   receiving an operation signal of a power cutoff circuit from an external device through a communicator;
   applying power to a heater resistor included in the power cutoff circuit based on the operation signal of the power cutoff circuit; and blocking a line through which a charge/discharge current of a battery flows when power is applied to the heater resistor to generate heat, wherein each of receiving, applying and blocking is performed by a power cutting off apparatus of a battery pack, and wherein the power cutting off apparatus includes the power cutoff circuit and the communicator, wherein the power cutoff circuit includes the heater resistor, a switch connected to the heater resistor, and an OR circuit connected to the switch, and wherein the OR circuit receives the operation signal of the power cutoff circuit from a control or the communicator and transmits the operation signal of the power cutoff circuit.

16. The battery pack power cutting off method of claim 15, further comprising:

a server detecting a security violation for the battery pack; and the communicator receiving the operation signal of the power cutoff circuit from the external device based on the detected security violation.

17. The battery pack power cutting off apparatus of claim 16, wherein the security violation is theft of a device including the power cutting off apparatus.

18. A battery pack power cutting off apparatus comprising:

a power cutoff circuit configured to block a line through which a charge/discharge current of a battery module flows;

a communicator configured to receive an operation signal of the power cutoff circuit from an external device; and a switching element configured to control to apply power to a heater resistor included in the power cutoff circuit based on an operation signal of the power cutoff circuit, wherein when power is applied to the heater resistor and generates heat, the power cutoff circuit operates to block the current flowing through the line, and wherein when a server detects a security violation for one or more battery packs of the battery module, the communicator receives an operation signal of the power cutoff circuit from the external device.

\* \* \* \* \*